(12) United States Patent
Hu et al.

(10) Patent No.: US 10,079,220 B2
(45) Date of Patent: Sep. 18, 2018

(54) PACKAGE SUBSTRATE HAVING A PLURALITY OF CHIPS ELECTRICALLY CONNECTED BY CONDUCTIVE VIAS AND WIRING BONDING

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 0 days.

(21) Appl. No.: 15/798,698

(22) Filed: Oct. 31, 2017

(65) Prior Publication Data
US 2018/0130771 A1    May 10, 2018

(30) Foreign Application Priority Data
Nov. 4, 2016    (TW) .............................. 105136014 A

(51) Int. Cl.
| | | |
|---|---|---|
| *H01L 23/34* | (2006.01) | |
| *H01L 21/4763* | (2006.01) | |
| *H01L 25/065* | (2006.01) | |
| *H01L 21/768* | (2006.01) | |
| *H01L 23/48* | (2006.01) | |

(Continued)

(52) U.S. Cl.
CPC .... *H01L 25/0652* (2013.01); *H01L 21/76877* (2013.01); *H01L 23/3121* (2013.01); *H01L 23/481* (2013.01); *H01L 23/528* (2013.01); *H01L 23/5226* (2013.01); *H01L 24/32* (2013.01); *H01L 24/48* (2013.01); *H01L 24/73* (2013.01); *H01L 25/0655* (2013.01); *H01L 2224/18* (2013.01); *H01L 2224/32225* (2013.01); *H01L 2224/48091* (2013.01); *H01L 2224/48137* (2013.01); *H01L 2224/48599* (2013.01); *H01L 2224/48799* (2013.01); *H01L 2224/73265* (2013.01); *H01L 2924/01029* (2013.01); *H01L 2924/01046* (2013.01);

(Continued)

(58) Field of Classification Search
CPC ............. H01L 25/0655; H01L 23/3121; H01L 23/5226; H01L 23/528; H01L 24/32; H01L 24/48; H01L 24/73; H01L 23/481; H01L 21/76877; H01L 25/0652
See application file for complete search history.

(56) References Cited

U.S. PATENT DOCUMENTS

| | | | | |
|---|---|---|---|---|
| 2013/0075903 A1* | 3/2013 | Pagaila | ................... | H01L 25/16 257/737 |
| 2015/0380334 A1* | 12/2015 | Hu | .......................... | H01L 23/36 257/712 |
| 2016/0172329 A1* | 6/2016 | Chang | ................ | H01L 23/3135 257/737 |

* cited by examiner

*Primary Examiner* — Alonzo Chambliss
(74) *Attorney, Agent, or Firm* — WPAT, PC

(57) ABSTRACT

This disclosure provides a package substrate and its fabrication method. The package substrate includes: a dielectric body; a first circuit device disposed in the dielectric body, the first circuit device comprising a first terminal and a second terminal at a top of the first circuit device; a second circuit device disposed in the dielectric body, the second circuit device comprising a third terminal at a top of the second circuit device; a first conductive pillar formed in the dielectric body and connected to the first terminal; a first bonding wire connecting the second terminal and the third terminal; and a redistribution layer comprising a first conductive wire formed on the dielectric body, the conductive wire connected to the first conductive pillar.

6 Claims, 4 Drawing Sheets

(51) Int. Cl.
 *H01L 23/31* (2006.01)
 *H01L 23/522* (2006.01)
 *H01L 23/528* (2006.01)
 *H01L 23/00* (2006.01)
(52) U.S. Cl.
 CPC .............. *H01L 2924/01047* (2013.01); *H01L 2924/01079* (2013.01)

PACKAGE SUBSTRATE HAVING A PLURALITY OF CHIPS ELECTRICALLY CONNECTED BY CONDUCTIVE VIAS AND WIRING BONDING

CROSS REFERENCE TO RELATED APPLICATION

This application claims the benefit of Taiwan application Serial No. 105136014, filed on Nov. 4, 2016, the disclosure of which is incorporated by reference herein in its entirety.

FIELD OF THE INVENTION

The present invention relates to a package substrate and its fabrication method.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package structure and the package technology are evolved accordingly to meet the trend.

Conventionally, a wafer-level packaging (WLP) process can be illustrated in FIG. 1A-1C. At first, an adhesive layer 18 is formed on a wafer carrier 11 as shown in FIG. 1A. Next, a semiconductor die 13 and an electronic component 15 with their connection terminals 16 at the bottoms are bonded onto the carrier 11 through the adhesive layer 18, and then a molding compound 12 is formed on the carrier 11 to cover the semiconductor die 13 and the electronic component 15 to be a package unit as shown in FIG. 1B. After the carrier 11 and the adhesive layer 18 is removed, the semi-finished package structure 20 is turned over and a redistribution layer (RDL) 17 is then formed on the upper surface 21 of the semi-finished package structure 20 as shown in FIG. 1C.

It is difficult to fabricate a fine-pitch-wiring RDL 17 by a conventional photolithography means, because fine-pitch wires can be realized only if the upper surface 21 of the semi-finished package structure 20 is very flat. However, to achieve the high surface flatness, a costly adhesive is needed as the adhesive layer 18 and the semiconductor die 13 and the electronic component 15 have to be bonded onto the adhesive layer 18 in a slow and precise way, which would increase the fabrication cost. Therefore, it is in need of a new and advanced packaging solution to reduce the fabrication cost.

SUMMARY OF THE INVENTION

According to one aspect of the present disclosure, one embodiment provides a package substrate including: a dielectric body; a first circuit device disposed in the dielectric body, the first circuit device comprising a first terminal and a second terminal at a top of the first circuit device; a second circuit device disposed in the dielectric body and not vertically overlapped with the first circuit device, the second circuit device comprising a third terminal at a top of the second circuit device; a first conductive pillar formed in the dielectric body and connected to the first terminal; a first bonding wire connecting the second terminal and the third terminal; and a redistribution layer comprising a first conductive wire formed on the dielectric body, the conductive wire connected to the first conductive pillar; wherein the first and second terminals are located at a first depth of the dielectric body, the third terminal is located at a second depth of the dielectric body, and the first depth is different from the second depth.

According to another aspect of the present disclosure, one embodiment provides a method for fabricating a package substrate comprising steps of: (A) providing a carrier, a first circuit device, and a second circuit device; wherein the first circuit device has a first surface and an opposite second surface and comprises a first terminal and a second terminal at the first surface, and the second circuit device has a third surface and an opposite fourth surface and comprises a third terminal at the third surface; (B) adhering the first and second circuit devices onto the carrier, while enabling both the second surface of the first circuit device and the fourth surface of the second circuit device to touch the carrier; wherein, the first and second terminals are located at a first height above the carrier, the third terminal is located at a second height above the carrier, and the first height is different from the second height; (C) forming a bonding wire by wire bonding while enabling the bonding wire to connect the second terminal and the third terminal; (D) forming a dielectric body while enabling the dielectric body to cover the first circuit device, the second circuit device, and the bonding wire; (E) forming an opening in the dielectric body while enabling the opening to be on the first terminal of the first circuit device; (F) filling the opening with a conductive material; and (G) forming a redistribution layer on the dielectric layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1A:
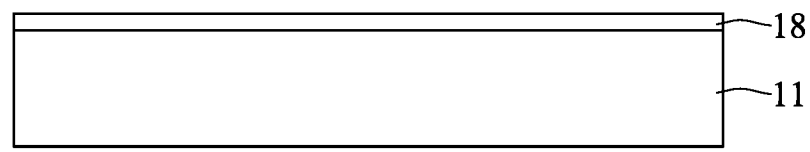
FIG. 1A-1C shows a conventional wafer-level packaging process.
Figure 1B:
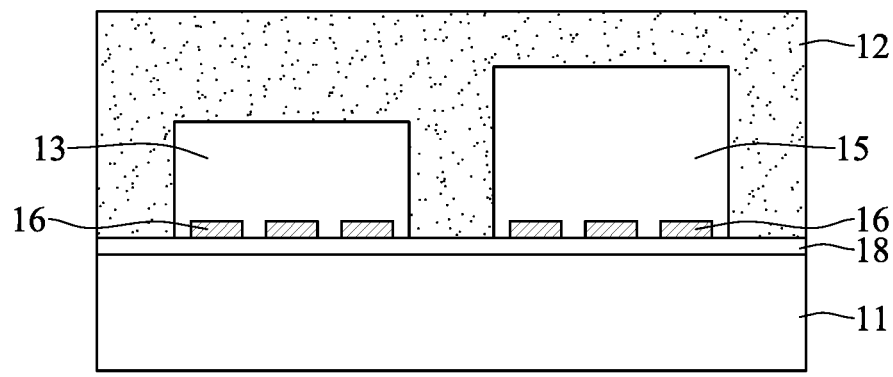
Figure 1C:
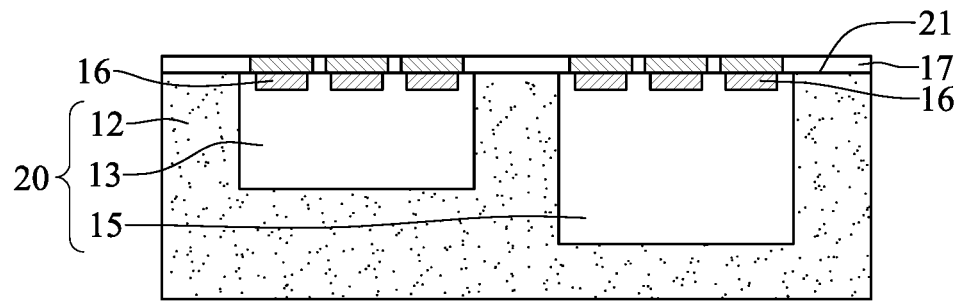
Figure 2:
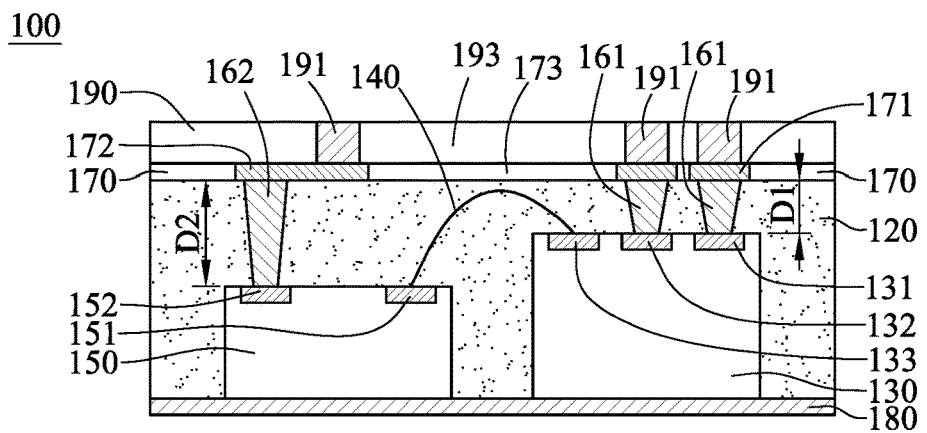
FIG. 2 is a cross-sectional view of the package substrate according to a first embodiment of the present invention.

FIG. 2 shows a cross-sectional view of the package substrate 100 according to a first embodiment of the present invention. The package substrate 100 includes: a dielectric body 120, a first circuit device 130, a bonding wire 140, a second circuit device 150, conductive pillars 161 and 162, and a redistribution layer (RDL) 170; wherein, the dielectric body 120 acts as the main body of the package substrate 100, which covers and surrounds the first circuit device 130, the bonding wire 140, and the second circuit device 150 and also supports the RDL 170. The first circuit device 130 is provided with plural terminals 131, 132 and 133 at its top, while the second circuit device 150 is provided with plural terminals 151 and 152 at its top. When the first circuit device 130 and the second circuit device 150 are disposed in the dielectric body 120 during the fabrication of the package substrate 100, the connecting pins or pads, the terminals 131-133 and 151-152, of both the first circuit device 130 and the second circuit device 150 face upwards.

The first circuit device 130 and the second circuit device 150 are bonded to the bottom of the dielectric body 120 by using an adhesion layer 180, so that the adhesion layer 180 is buried in the dielectric body 120 and the first circuit device 130 is not vertically overlapped with the second circuit device 150. In the embodiments, each of the first circuit device 130 and the second circuit device 150 may be an IC chip or a semiconductor die like application-specific IC (ASIC) or memory device. The circuit devices 130 and 150 can also be a passive electronic component like multi-layer ceramic capacitor (MLCC). As shown in FIG. 2, the first circuit device 130 and the second circuit device 150 have different thicknesses; hence the terminals 131-133 and the terminals 151-152 are respectively located at different depths D1 and D2 down from the top of the dielectric body 120.

The bonding wire 140 can be formed by the wire bonding method to connect the first circuit device 130 and the second circuit device 150. More specifically, the bonding wire 140 is used to connect the terminal 133 of the first circuit device 130 to the terminal 151 of the second circuit device 150. Thereby, a circuit device can be electrically connected to other circuit device of different thickness by wire bonding, which is generally considered the most cost-effective and flexible interconnect technology. The bonding wire 140 may be made of gold (Au), silver (Ag), copper (Cu), palladium (Pd), or their combinations.

The conductive pillars 161 and 162 can be formed by first laser drilling (or laser ablating) or plasma etching through openings in the dielectric body 120, where the ones on the terminals 131 and 132 have a depth D1 while the one on the terminal 152 has a depth D2, and then filling the through openings with conductive material by electro-plating. Though the terminals 131, 132 and 152 are not in the same horizontal, the conductive pillars 161 and 162 can compensate the depth discrepancy between the terminals 131 and 132 of the first circuit device 130 and the terminal 152 of the second circuit device 150; thus, fine-pitch conductive wires of the RDL 170 can be laid out on a flat top surface of the dielectric body 120 and processed by using a conventional photolithography means.

The RDL 170 is an extra metal layer laid out on the dielectric body 120, that makes the access pads (the terminals 131-133 and 151-152) of the circuit devices 130 and 150 available in other locations. In other words, when the circuit devices 130 and 150 are disposed in the dielectric body 120, the locations of the terminals 131-133 and 151-152 are firmly fixed after the dielectric body 120 is hardened; so, the RDL 170 can electrically redistribute the locations of the terminals 131-133 and 151-152 to appropriate locations. The RDL 170 may include plural conductive wires 171 and 172 formed on the conductive pillars 161 and 162, respectively. As shown in FIG. 2, the conductive pillar 161 is used to connect the terminal 131/132 to the conductive wire 171, while the conductive pillar 162 is used to connect the terminal 152 to the conductive wire 172.

To connect the conductive wires 171 and 172 upwards to an external circuit, a pillar layer 190 is formed on the RDL 170. The pillar layer 190 may include plural metal pillars 191 corresponding to the conductive wires 171 and 172. As shown in FIG. 2, the conductive wires 171 and 172 occupy a part space of the RDL 170 while the metal pillars 191 occupy a part space of the pillar layer 190. The remainder spaces 173 and 193 can be filled with suitable dielectric material, so that the package substrate 100 becomes a complete package device. In the embodiment, the adhesion layer 180 may be made of insulating material bonded to the bottom of the dielectric body 120, so as to protect the package substrate 100 from being damaged by external objects.

Figure 3:
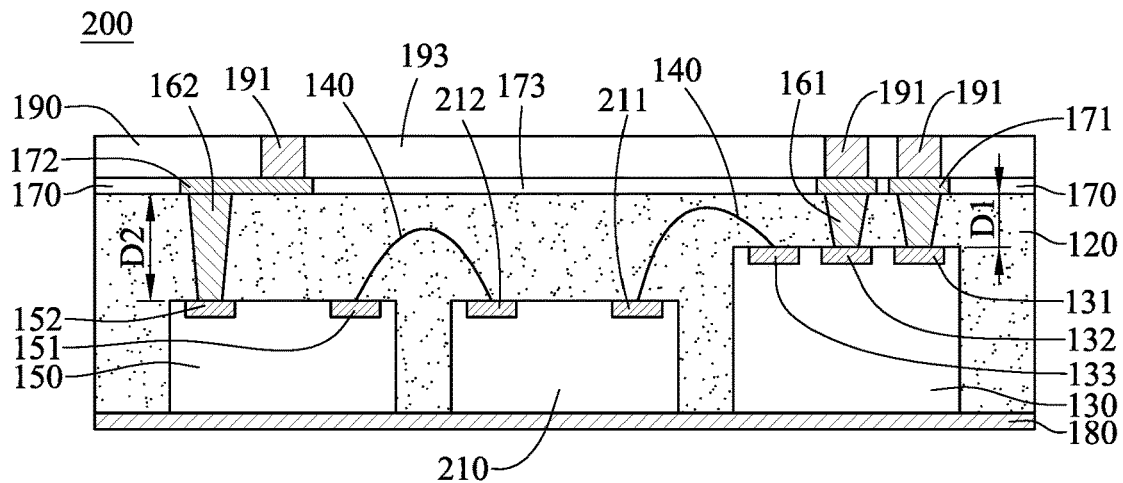
FIG. 3 is a cross-sectional view of a package substrate according to a second embodiment of the present invention.

FIG. 3 is a cross-sectional view of a package substrate 200 according to a second embodiment of the present invention. The package substrate 200 is in many ways identical to the package substrate 100 of the first embodiment in FIG. 2, but the package substrate 200 further includes a third circuit device 210 between the first circuit device 130 and the second circuit device 150. The third circuit device 210 is provided with plural terminals 211 and 212 at its top. A bonding wire 140 is used to connect the terminal 133 of the first circuit device 130 to the terminal 211 of the third circuit device 210, while the other bonding wire 141 is used to connect the terminal 151 of the second circuit device 150 to the terminal 212 of the third circuit device 210. The conductive pillar 161 is used to connect the terminal 131/132 to the conductive wire 171, while the conductive pillar 162 is used to connect the terminal 152 to the conductive wire 172. Thereby, the current invention can be applicable to a package substrate with plural circuit devices.

The fabrication process will be described in detail in the following paragraphs. Wherein, FIGS. 4-8 and 3 are cross-sectional views of the package substrate 100 of the first embodiment in the present disclosure, corresponding to different process steps. A panel-level packaging (PLP) process is used in the embodiment, and is different from the wafer-level packaging (WLP) process.

At first, a carrier substrate 110 is provided to carry and support electronic components and conductive wires of the package substrate 100 in the fabrication process. The carrier substrate 110 can be a metal plate or a dielectric plate coated with a metal layer, in which the metal can be Fe, Cu, Ni, Sn, Al, Ni/Au or their combination.

Figure 4:
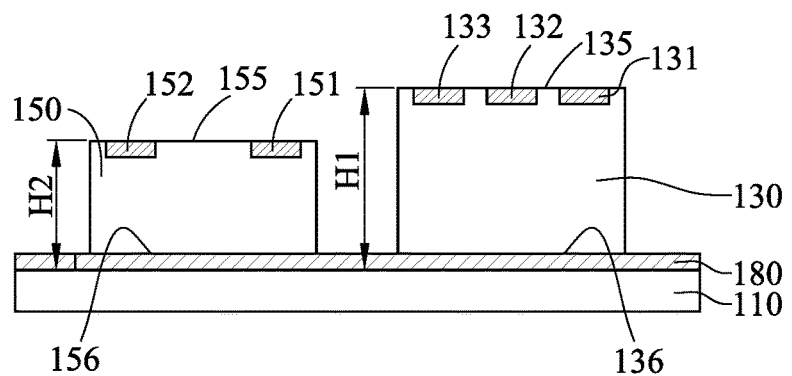
FIG. 4-8 are cross-sectional views of the package substrate of the first embodiment in the present disclosure, corresponding to different process steps.

Next, a first circuit device 130 and a second circuit device 150 are adhered to the carrier substrate 110 as shown in FIG. 4. The first circuit device 130 has a first surface 135 and an opposite second surface 136, and its connecting pads or terminals 131-133 are arranged at the first surface 135. The second circuit device 150 has a third surface 155 and an opposite fourth surface 156, and its connecting pads or terminals 151-152 are arranged at the third surface 155. Here, the circuit devices 130 and 150 are adhered to the carrier substrate 110 by using an adhesion layer 180, while enabling both the second surface 136 of the first circuit device 130 and the fourth surface 156 of the second circuit device 150 to touch the top surface of the carrier substrate 110. Wherein, the first circuit device 130 is not vertically overlapped with the second circuit device 150. If the first circuit device 130 and the second circuit device 150 are semiconductor dies or electronic components with different thicknesses, the terminals 131-133 and 151-152 are respectively located at different heights H1 and H2 above the top of the carrier substrate 110 (H1≠H2).

Figure 5:
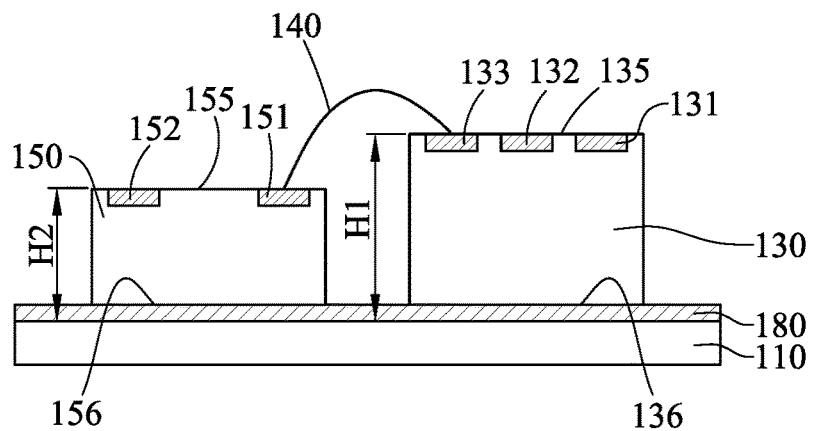

Next, a bonding wire 140 can be formed by the wire bonding method to connect the first circuit device 130 and the second circuit device 150, as shown in FIG. 5. More specifically, the bonding wire 140 is used to connect the terminal 133 of the first circuit device 130 to the terminal 151 of the second circuit device 150. Thereby, a circuit device can be electrically connected to other circuit device of different thickness by wire bonding, which is generally considered the most cost-effective and flexible interconnect technology. The bonding wire 140 may be made of gold, silver, copper, palladium, or their combinations.

Figure 6:
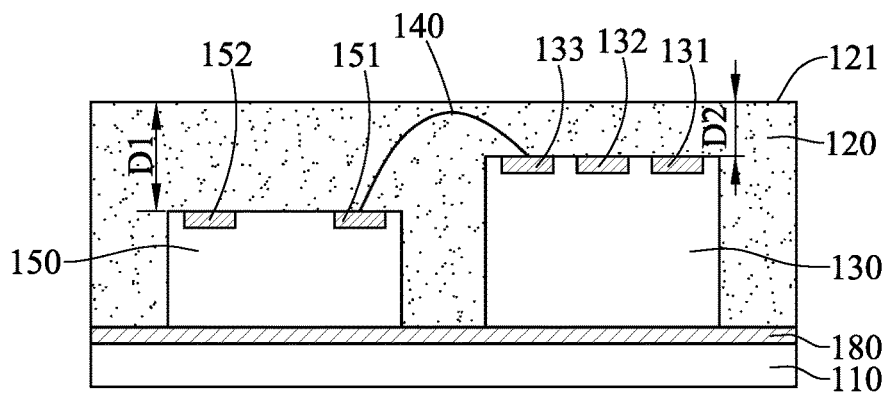

Next, a dielectric body 120 is formed on the carrier substrate 110 to cover the circuit devices 130 and 150 as shown in FIG. 6. The dielectric body 120 can be formed of an insulation material selected from the group consisting of novolac-based resin, epoxy-based resin and silicon-based resin by a molding means like compression molding or thin-film vacuum molding. After the dielectric body 120 is cured or hardened, the first circuit devices 130, the bonding wire 140, the second circuit device 150, and the dielectric body 120 can be combined to be a firm package unit. The dielectric body 120 is then polished or ground to remove the upper part of the dielectric body 120 in a top-down manner, so as to get a flat top surface 121 for the fabrication of a fine-pitch RDL 170. The terminals 131 and 151 are respectively located at different depths D1 and D2 down from the top surface 121 of the dielectric body 120.

Figure 7:
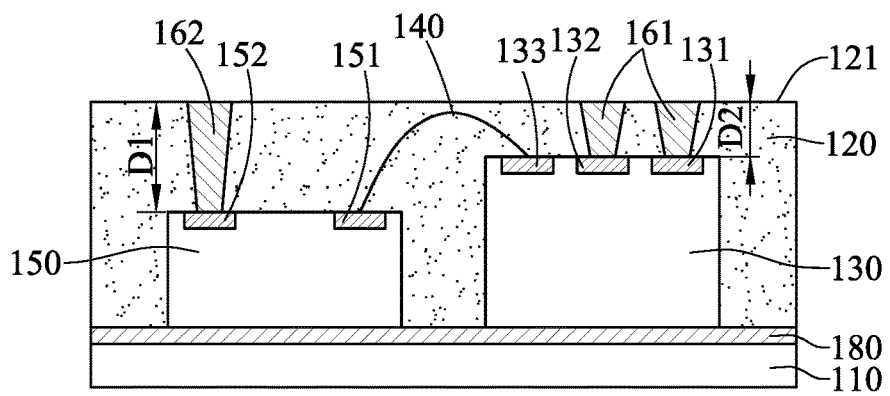

Next, the conductive pillars 161 and 162 are formed in the dielectric body 120 as shown in FIG. 7. The conductive pillars 161 and 162 can be formed by first laser drilling (or laser ablating) or plasma etching through openings in the dielectric body 120, where the ones on the terminals 131 and 132 have a depth D1 while the one on the terminal 152 has a depth D2, and then filling the through openings with conductive material by electro-plating. Because the terminals 131/132 and 152 are respectively located at different depths D1 and D2 down from the top surface 121 of the dielectric body 120, the through openings can be formed by different laser energies. If a pulsed laser is used to drill the above-recited through openings, the opening depths would depend on wavelength and pulse width of the laser as well as optical property of the dielectric body 120. Here, the laser energy for drilling the first through opening 162 is larger than that for the second through opening 161. The through openings 140 and 160 are then filled with either metal like copper, nickel and tin or conductive material like copper paste, silver paste and solder, to be the conductive pillars 161 and 162.

Figure 8:
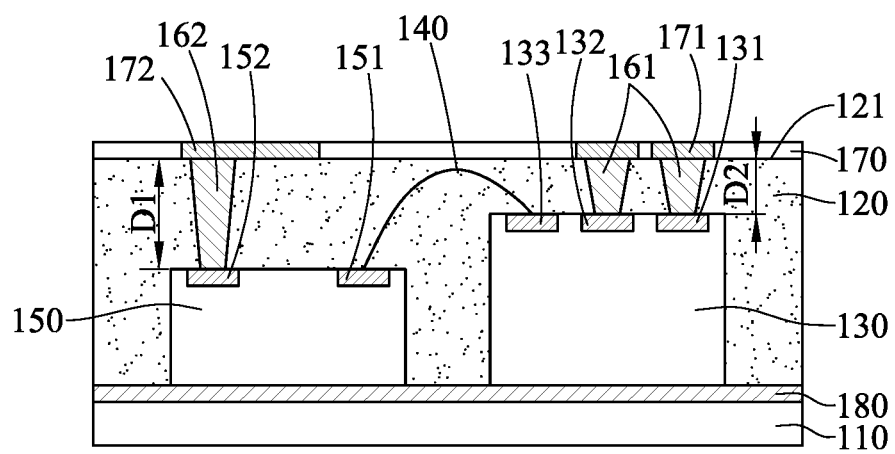

Next, a RDL 170 is formed on the conductive pillars 161 and 162 as shown in FIG. 8. The RDL 170 is an extra metal layer laid out on the dielectric body 120, which makes the access pads (the terminals 131-133 and 151-152) of the circuit devices 130 and 150 available in other locations. Though the terminals 131, 132 and 152 are not in the same horizontal, the conductive pillars 161 and 162 can compensate the depth discrepancy between the terminals 131/132 of the first circuit device 130 and the terminal 152 of the second circuit device 150; thus, fine-pitch conductive wires of the RDL 170 can be laid out on a flat top surface 121 of the dielectric body 120 and processed by using a conventional photolithography means.

Next, a pillar layer 190 including plural metal pillars 191 is formed on the RDL 170. As shown in FIG. 2, the conductive wires 171 and 172 occupy a part space of the RDL 170 while the metal pillars 191 occupy a part space of the pillar layer 190. The remainder spaces 173 and 193 can be filled with suitable dielectric material, so that the package substrate 100 becomes a complete package device. In the embodiment, the carrier substrate 110 is a metal plate and the adhesion layer 180 is made of thermally conductive material, so that their combination can act as a heat sink for the circuit devices 130 and 150.

In another embodiment, the adhesion layer 180 may be made of insulating material, and the carrier substrate 110 can be removed as shown in FIG. 2. Here, the adhesion layer 180 may act as a protective layer bonded to the bottom of the dielectric body 120, so as to protect the package substrate 100 from being damaged by external objects.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package substrate comprising:
  a dielectric body;
  a first circuit device disposed in the dielectric body, the first circuit device comprising a first terminal and a second terminal at a top of the first circuit device;
  a second circuit device disposed in the dielectric body and not vertically overlapped with the first circuit device, the second circuit device comprising a third terminal at a top of the second circuit device;
  a first conductive pillar formed in the dielectric body and connected to the first terminal;
  a first bonding wire connecting the second terminal and the third terminal; and
  a redistribution layer comprising a first conductive wire formed on the dielectric body, the conductive wire connected to the first conductive pillar;
  wherein the first and second terminals are located at a first depth of the dielectric body, the third terminal is located at a second depth of the dielectric body, and the first depth is different from the second depth.

2. The package substrate of claim 1, wherein the first bonding wire is made of gold, silver, copper, palladium, or their combinations.

3. The package substrate of claim 1, wherein the first circuit device comprises a semiconductor chip or an electronic component, and the second circuit device comprises a semiconductor chip or an electronic component.

4. The package substrate of claim 1, wherein the second circuit device further comprises a fourth terminal at the top of the second circuit device, the redistribution layer further comprises a second conductive wire, and the package substrate further comprises a second conductive pillar formed in the dielectric body and connecting the fourth terminal and the second conductive wire.

5. The package substrate of claim 1, wherein the second circuit device further comprises a fourth terminal at the top of the second circuit device, and the package substrate further comprises:
   a third circuit device disposed in the dielectric body, the third circuit device comprising a fifth terminal at a top of the third circuit device; and
   a second bonding wire connecting the fourth terminal and the fifth terminal.

6. The package substrate of claim 1, wherein a protective layer is formed below the dielectric body.

\* \* \* \* \*